Figure 1:
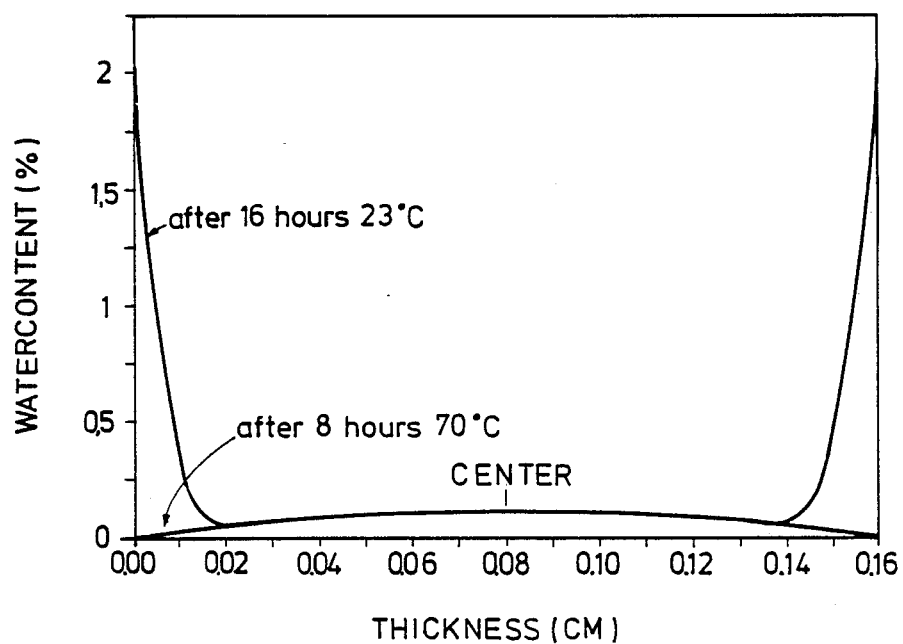

United States Patent [19]

Peerlkamp

[11] Patent Number: 4,923,735
[45] Date of Patent: May 8, 1990

[54] MOULDED PRINTED CIRCUIT BOARD

[75] Inventor: Erik R. Peerlkamp, Born, Netherlands

[73] Assignee: Stamicarbon B.V., Geleen, Netherlands

[21] Appl. No.: 292,237

[22] Filed: Dec. 30, 1988

[30] Foreign Application Priority Data

Dec. 31, 1987 [NL] Netherlands ................... 8703166

[51] Int. Cl.$^5$ .............................................. B32B 9/00
[52] U.S. Cl. ................................... 428/209; 428/280;
428/284; 428/285; 428/286; 428/287; 428/457;
428/458; 428/474.4; 428/901; 174/35 MS
[58] Field of Search ................ 174/35 MS; 428/209,
428/474.4, 457, 458, 280, 284, 285, 286, 287,
901

[56] References Cited

U.S. PATENT DOCUMENTS

| | | | |
|---|---|---|---|
| 2,606,162 | 8/1952 | Coffey et al. | 525/129 |
| 2,892,747 | 6/1959 | Dye | 428/458 |
| 4,165,303 | 8/1979 | Schlossmen et al. | 524/285 |
| 4,719,284 | 1/1988 | Nielinger et al. | 528/335 |
| 4,722,997 | 2/1988 | Roerdink et al. | 528/336 |
| 4,760,109 | 7/1988 | Chiba | 524/452 |
| 4,761,445 | 8/1988 | Chiba | 524/538 |

OTHER PUBLICATIONS

Modern Plastics Encyclopedia, 1989, pp. 30-31; 1980-1981, p. 40; and 1977-1978, pp. 41-42.

*Primary Examiner*—Patrick Ryan
*Attorney, Agent, or Firm*—Cushman, Darby & Cushman

[57] ABSTRACT

The invention relates to a thermoplastic moulded printed circuit board consisting substantially of polyamide 4.6. Preferably use is made of a multilayer structure, of which at least one layer contains reinforcing filler material.

6 Claims, 1 Drawing Sheet

MOULDED PRINTED CIRCUIT BOARD

The invention relates to moulded printed circuit boards of a thermoplastic polymer material.

In principle, such printed circuit boards present great advantages when compared with the currently used flat printed circuit boards made of glass-fibre reinforced thermosetting resins, such as phenol and epoxy resins.

An example of such a moulded printed circuit board is to be found in the lecture: Thermoplastische Werkstoffe für gedrückter Schaltungen by Dr. U. Zwick, held at the Fachtagung Polymerwerkstoffe für die Elektronik, Würzberg, 14–16 Oct., 1987. Important advantages of these printed circuit boards are the greater freedom of design and the possibility of injection moulding various functional parts, such as sockets, integrally with the board, whereas in the case of the conventional flat printed circuit boards made of thermosetting resins these must be accomplished separately.

The thermoplastic polymers must meet a series of requirements to be suitable for use in moulded printed circuit boards. Besides a high heat deflection temperature and good processability, in injection moulding, metallizability, dimensional stability, chemical resistance, and dielectric properties that are not affected by temperature or frequency and flame retardance are required.

Zwick mentions polyetherimide (PEI), polyether sulphone (PES) and polyphenylene sulphide (PPS), all glass-fibre reinforced, as suitable thermoplastics that are resistant to high temperatures.

Of these potential thermoplastic materials only PEI, polyetherimide, appears to be resistant to the high temperatures required for soldering. Other polymers such as ABS and polycarbonate that are very suitable for use as casings, cannot be used until the soldering techniques requiring high temperature resistance have been replaced by reliable low-temperature electrical sealing techniques. Another disadvantage of the aforementioned polymers in moulded printed circuit boards is the poor adhesion of the metals used for the circuits. This is particularly the case if these are applied with vacuum plating or sputtering techniques, and is due to the evolution of volatile components from the polymer under the processing conditions. Because of this, polyetherimide is not suitable either. LAccording to J. H. Levy, in his lecture in Engineering Plastics II, "The growing E/E Market for High Performance Plastics, which he held at the Engineering Plastics Seminar—Shaping the future II, on 2nd Nov., 1987, at Solihull, UK, research has come close to producing a performance plastic for moulded printed circuit boards, but a plastic that meets all the requirements has not yet been found.

The object of the invention, is to produce a thermoplastic polymer which meets all or the requirements for application in moulded printed circuit boards, in particular the requirements of high heat deflection temperature, solderability and adhesion to metals and which, if used as a casing, has a good appearance.

The moulded printed circuit board of thermoplastic polymer material according to the invention is characterized in that the polymer is composed substantially of tetramethylene adipamide units. The polymer consisting substantially of tetramethylene adipamide may also contain other monomers which partially replace the tetramethylene diamine or adipic acid. In principle, the copolymer is only limited to such concentrations that the mechanical and thermal properties of the material are not adversely affected. In practice, this concentration will not exceed 30%, and will preferably be less than 20%. Examples of copolymers are amide-forming compounds such as lactams, dicarboxylic acids and diamines, imide-forming compounds and ester-forming compounds such as ethylene terephthalate and butyl terephthalate. Copolymers may, for example, be used to improve the processability in injection moulding or to influence the water-absorbing behaviour.

It is particularly advantageous if the moulded printed circuit board is composed of several layers.

The polymer may consist also of a mixture of polytetramethyleneadipamide and polymers based on the above monomers, for instance 6, 6.6, 12, polyimides and polyesters, or mixtures with other polymers for instance polysulfones, polyethersulfones and polyphenylenesulfide that may offer specific advantages.

The moulded printed circuit board according to the invention preferably contains a layer filled with reinforcing fillers. Suitable reinforcing fillers are, for example, fibres, such as inorganic fibres or polymer fibres, and/or plate-shaped fillers such as mica, clay and talc, and/or spherical fillers such as glass beads, and/or rod-shaped fillers and/or powdered fillers, such as chalk. Preferably a combination of fibrous and non-fibrous fillers is used. The best dimensional stability is obtained when the fibrous filler material is present in minor amounts, as a result of which the effect of anisotropy is suppressed. The percentage of fillers may vary within wide limits, for example from 15 to 80 wt.%, based on the total weight of the layer containing the reinforcing filler. The choice of the amount of reinforcing filler is partly determined by the nature and the shape of the filler, the desired mechanical properties and the processing conditions.

In addition to this, the composition may contain the usual additives, such as stabilizers, lubricants, flame retardants, release agents, colourants and pigments.

The printed circuit board preferably contains at least one layer which contains a material that provides protection against electromagnetic interference. Such a material may consist of, for example, metal fibres or plates, for example steel and nickel fibres or aluminium flakes, metallized fillers, such as plastic or carbon fibres and mica covered with for instance nickel. In such cases the printed circuit board can also serve as casing.

The moulded printed circuit board may have various shapes and can be produced by for instance compression moulding of solid particles of the polyamide, by (co-) extrusion of flat plates, by pressing plates of the polyamide and injection moulding. By plating with for instance copper and further treatment, for instance machining, the final moulded circuit board may be obtained. For small series it may prove advantageous to obtain the moulded printed circuits by machining stock shapes (for instance extruded rods) which shapes are consequently metallized.

The following examples will demonstrate the particular advantages of moulded printed circuit boards manufactured from thermoplastic polymer which contains substantially tetramethylene adipamide units as compared with printed circuit boards according to the state of the art.

Test boards were injection moulded using a number of compositions. The following properties were determined of these test boards, see Table 1.

TABLE 1

| COMPOSITION Property | Standard | units | PA 4.6 30% Glass fibre | PA 4.6 20% mica 15% Glass fibre | PA 4.6/MXD.6 80/20 30% Glass fibre | Epoxy (FR4) 20% glass fibre fabric |
| --- | --- | --- | --- | --- | --- | --- |
| Meltingpoint | | °C. | 292 | 272 | 272 | not relevant |
| IZOD notched | ASTM D180 | KJ/m$^2$ | 10 | 10 | — | 3 |
| HDT at 1.8 MPa | ASTM D648 | °C. | 284 | 286 | 262 | — |
| CUT 10,000 hr | UL 746B | °C. | 150 | 150 | 150 | 125 |
| coefficient of expansion[1] | ASTM D696 | $10^{-6}$/°K. | 30 | 30 | — | 20 |
| coefficient of expansion[2] | ASTM D696 | $10^{-6}$/°K. | 55 | 35 | — | 77 |
| volume resistivity | ASTM D257 | Ω cm | $10^{15}$ | $10^{15}$ | $10^{15}$ | $<10^{13}$ |
| surface resistance | ASTM D257 | Ω | $10^{15}$ | $10^{15}$ | $10^{15}$ | $<10^{13}$ |
| tracking resistance CTI | ASTM D3638 | V | 225 | 225 | 220 | — |
| dielectric constant | | | | | | |
| 1 KHz | DIN 53483 | | 4.4 | 4.4 | 3.0 | — |
| 1 MHz | | | 4.2 | 4.2 | | $<5.5$ |
| Water absorption 24 hr | ASTM D570 | wt. % | 0.9 | 1.0 | 0.6 | 0.03 |

[1] in injection moulding direction
[2] perpendicular to injection moulding direction
PA 4.6: STANYL R produced by DSM, the Netherlands heat stabilized. $\eta_{rel} = 3.0$
PA 4.6/MXD: copolyamide of tetramethylene adipamide and metaxylidene
Epoxy FR 4: standard printed circuit board of epoxy resin reinforced with glass fibre
CUT: continous use temperature at which the tenile strength has decreased to 50% of the original value after 10,000 hours.
All properties were determined using dry samples.

The test boards have a smooth surface and present no discolorations. Due to its relatively high concentration of terminal amine groups, the polyamide surface can be well metallized. An even better surface is obtained if, as outer layer, a layer consisting of non-reinforced polyamide is produced with a multilayer injection moulding technique.

However the electrical properties of polyamides in humid conditions seem to effect the application of polyamides in general, and more specifically polytetramethylene adipamide in circuit boards. Data are shown in Table 2.

TABLE 2

Influence of moisture content on electrical properties and dimensional stability of polyamide 4.6

| | D | C* |
| --- | --- | --- |
| volume resistance [Ω] | $10^{15}$ | $10^{13}$–$10^9$ |
| surface resistance [Ω] | $10^{14}$–$10^{15}$ | $10^{13}$–$10^{10}$ |
| swell % | | 0.6 |

D = dry
C = conditioned according to ISO 1110, accelerated method; 70° C./62% relative humidity
*The resistance values found after conditioning vary considerably, depending on the additives (fillers and/or stabilizers).

The inventor has found that this problem does not exist in practice. An explanation for unexpected discovery finding can be the fact that in electric or electronic installations heat is dissipated, resulting in an increase of temperature, and consequently a lowering of the relative humidity, causing the volume and surface resistance to remain high.

Intermittent use of a 3-dimensional printed circuit board according to the invention, which results in a temperature cycle, appears to present particular advantages, as will become apparent from the following example.

EXAMPLE

A 1.6 mm thick test board moulded from STANYL ®* 250 F6 is subjected to the following temperature cycle: 16 hours at room temperature (23° C.) in the prevailing relative humidity of 54%, after which the temperature is raised to 70° C. and maintained at this temperature for 8 hours (the relative humidity then decreases to 2%), and is then reduced to room temperature again.

FIG. 1 shows the water content of the test board at different points in the board during these cycles.

This shows that the bulk of the board always has a very low water content and that only a very thin layer at the surface has a varying water content and the dimensions of the board are barely affected. The bulk electric resistance properties of the test board are also barely affected and remain at the high values required for electronic applications. The water-containing surface layer, however, causes the surface conductance to increase and this increase in surface conductance, which is restricted in time and magnitude can, however, in many cases be advantageous in preventing static charging and does not have a negative effect on the operation of the circuits.
*STANYL®250 F6 Polytetramethyleneadipamide of DSM, Netherlands, containing 30% (wt) glass fiber and 20% (wt) flame retardant.

I claim:

1. Moulded circuit board of a thermoplastic polymer composition, wherein the polymer is composed substantially of tetramethylene adipamide units.

2. Moulded printed circuit board according to claim 1, wherein said printed circuit board comprises several layers of which at least one layer contains at least one reinforcing material chosen from fibrous and non-fibrous materials.

3. Moulded printed circuit board according to claim 2, wherein said reinforcing material contains at least one fibrous and one non-fibrous filler.

4. Molded printed circuit board according to claim 3, wherein said fibrous material is present in a minor amount with respect to the non-fibrous material resulting in a suppression of the effect of anisotropy on the dimensional stability of said molded printed circuit board.

5. Molded printed circuit board according to claim 2, wherein said printed circuit board comprises at least one layer containing a metallic or metallized filler with electromagnetic shielding properties.

6. An electrical casing consisting essentially of a molded printed circuit board of a thermoplastic polymer composition, wherein said polymer is composed substantially of tetramethylene adipamide units.

* * * * *